United States Patent [19]

Vasseur

[11] Patent Number: 4,591,228
[45] Date of Patent: May 27, 1986

[54] MECHANICAL FASTENING DEVICE FOR ASSEMBLING ELECTRICAL EQUIPMENT MODULES

[75] Inventor: André Vasseur, Soignies, Belgium
[73] Assignee: Merlin Gerin, Grenoble, France
[21] Appl. No.: 637,263
[22] Filed: Aug. 2, 1984
[30] Foreign Application Priority Data
Aug. 17, 1983 [FR] France .................. 83 13466
[51] Int. Cl.⁴ .............................. H01R 9/26
[52] U.S. Cl. ..................... 339/198 H; 339/198 G
[58] Field of Search .......... 339/198 G, 198 H, 206 R, 339/206 P, 198 GA, 198 R, 91 R, 47 R, 49 R, 198 E, 198 K, 198 M, 198 S

[56] References Cited
U.S. PATENT DOCUMENTS
2,957,155 10/1960 Ehrlich .................. 339/198 GA
3,160,280 12/1964 Burch .................... 339/198 GA
3,289,852 12/1966 Kahn ..................... 211/13
4,090,764 5/1978 Malsby et al. ............ 339/198 GA FOREIGN PATENT DOCUMENTS
2428756 1/1975 Fed. Rep. of Germany ...... 339/198 GA
2815215 10/1979 Fed. Rep. of Germany .
1232356 10/1960 France ................. 339/198 GA
2491284 4/1982 France .

Primary Examiner—Gil Weidenfeld
Assistant Examiner—Thomas M. Kline
Attorney, Agent, or Firm—Parkhurst & Oliff

[57] ABSTRACT

The molded casing of modular elements are assembled by slides which move in transverse grooves or runners fitted in the casings. The slide catches on ratching notches fitted in the runner.

6 Claims, 7 Drawing Figures

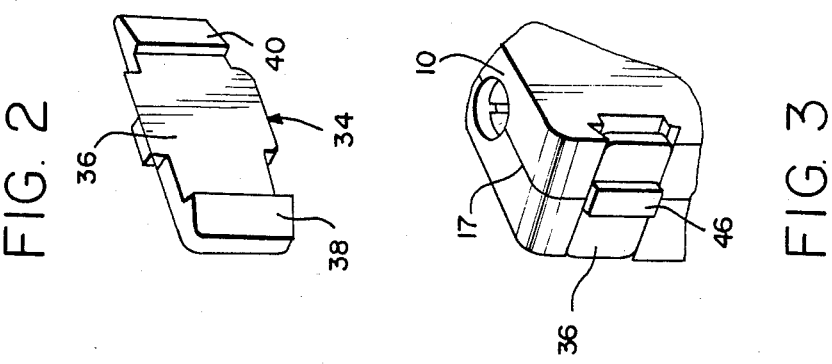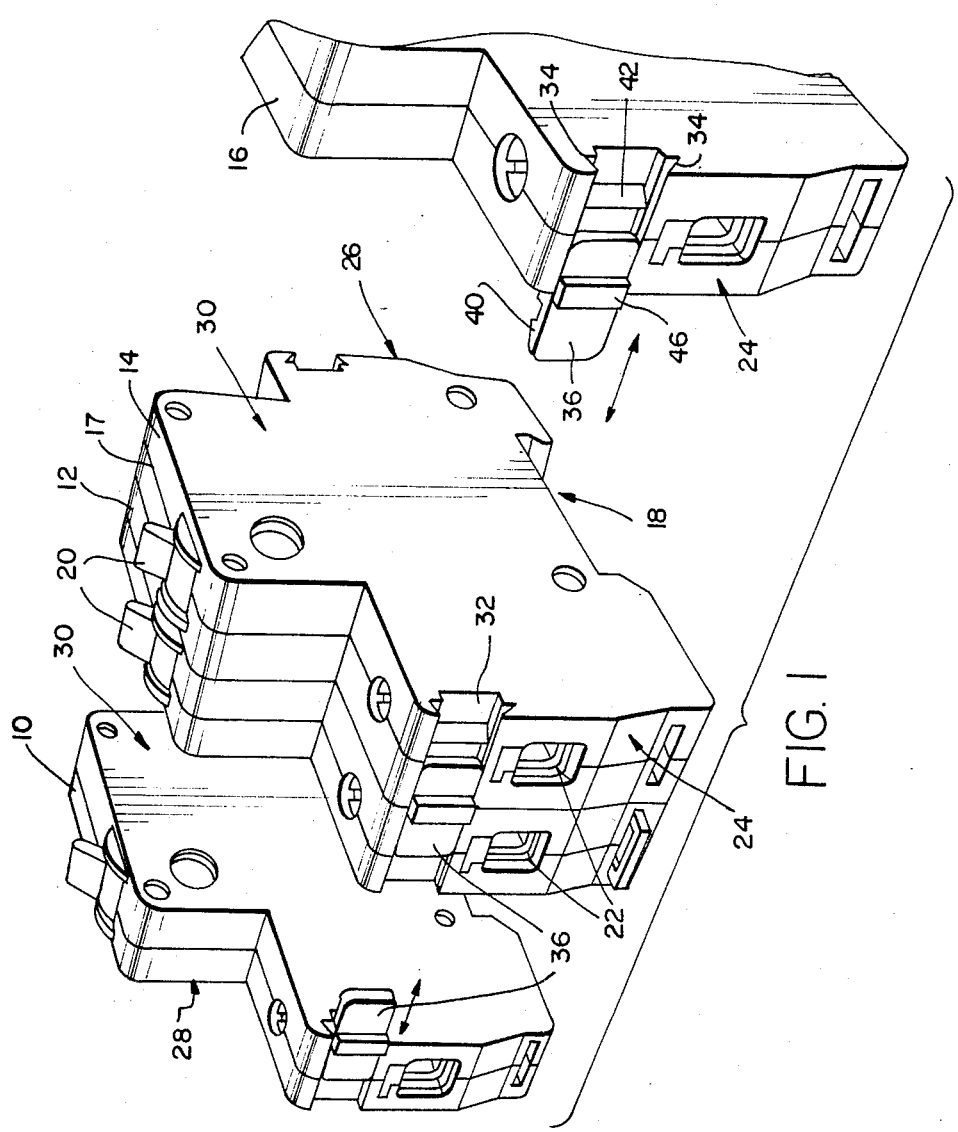

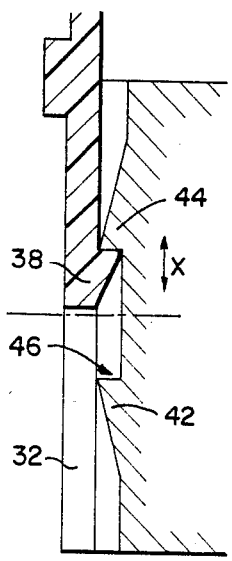
FIG. 5
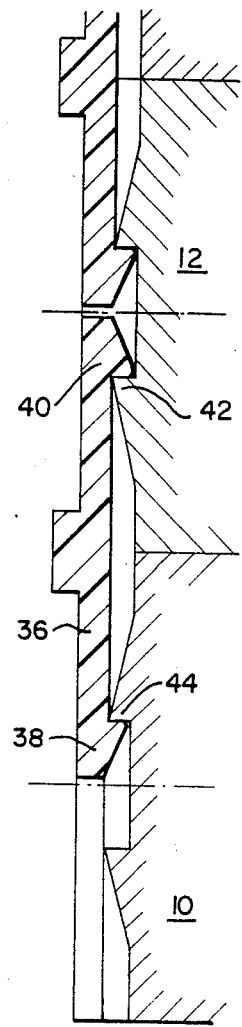
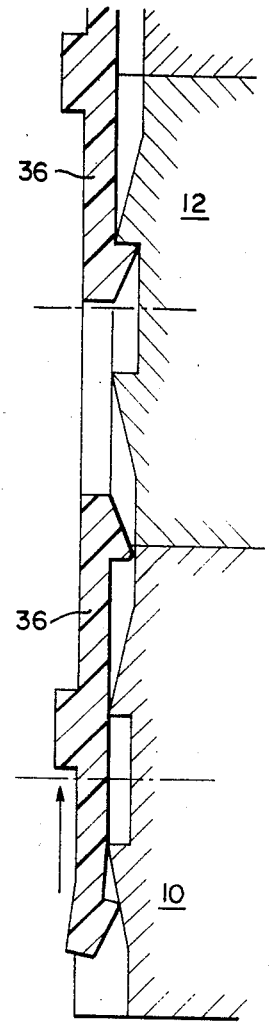
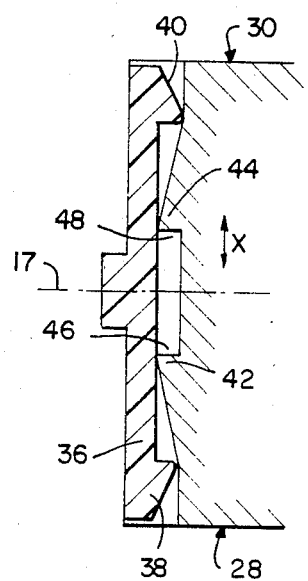
FIG. 7  FIG. 6  FIG. 4

MECHANICAL FASTENING DEVICE FOR ASSEMBLING ELECTRICAL EQUIPMENT MODULES

BACKGROUND OF THE INVENTION

The invention relates to a mechanical fastening device for assembling or securing together two components, such as two molded cases containing electrical equipment and maintained in side by side relationship. The device includes a connection part or member which secures the coupled cases together in ratched or fastened position.

A known fastening device of this type comprises a connecting part inserted in a socket in one of the casings and ratched onto the coupled casing. This type of connection is suitable for the fixation of an auxiliary module or unit and the connecting part is mounted on the side face coupled to the adjacent module. The assembly of this auxiliary module by its opposite face requires the changing over of sides of the connecting parts. The mounting of these parts, which is held by a spring, is delicate so that the part can become detached and lost. The outline framework of an element fitted with these connecting parts is different to that of an element without, which complicates packaging.

SUMMARY OF THE INVENTION

It is an object of this invention to provide a simple universal assembling or fastening device.

The assembling device according to the invention comprises a connecting part in the form of a slide made of an insulating material which is mounted to slide in grooves or runners provided in the casings. These grooves or runners are aligned when the casings are in the coupled position and incorporate a ratchet mechanism of the slide.

The use of an insulating part avoids any propagation of dangerous potentials and enables the connecting part to be placed near the live elements, particularly the connection terminals. The slide is housed in a groove in the form of a casing runner without increasing the outline framework of the casing. Each module, for example each miniature casing of a modular electrical equipment system, can be equipped with a slide factory mounted on the closed casings or placed in position by the consumer or the installer if necessary. The slide is moved towards the side of the module to be coupled and the module is ratched onto the slide, or preferably onto two slides placed on the module. It is also possible to place the two modules side by side and then to move the slide into ratched position on the coupled modules. The modules are mounted on a support, notably by ratching on a DIN rail, the connecting part(s) holding the coupled modules and reinforcing the connection.

The slide and the runner present a plane of symmetry corresponding to the transversal plane of symmetry of the casing, and an assembly by way of one side or the other is carried out in exactly the same manner by reciprocating the slide in one direction or the other. The slide is held in the runner by a dove-tail shaped piece and ratchet teeth are provided in the bottom of the runner. The ratchet mechanism is operated by an elastic deformation on the edge of the slide in the shape of a hook or nose which catches on a projecting notch or interlocking piece.

The slide mounted on the casing cannot be lost as the two projecting notches hold it in a central position. The unit is simple and ensures precise positioning of the assembled parts, for which only the casing has been modified to provide one or several slide housing runners, notably on the lateral faces of the casings above the terminals.

BRIEF DESCRIPTION OF THE DRAWINGS

Other advantages and characteristics will become more evident with the description which will follow of a mode of operation of the invention, provided as an unlimiting example and represented in the annexed drawings in which:

FIG. 1 is a schematic perspective view of the modules according to the invention during assembly;

FIG. 2 is a perspective view of an assembling slide according to FIG. 1;

FIG. 3 is a partial perspective view of a slide mounted on a module; and

FIGS. 4 to 7 are sectional views of the slide and the runner represented respectively in central position, in laterally moved position, during assembly and in assembled position.

DETAILED DESCRIPTION OF PREFERRED EMBODIMENT

In these figures, the modules of units, for instance miniature molded case circuit breakers have casings 10, 12, 14, 16, in the form of two half-shells assembled according to a plane of symmetry. Each module contains elements constituting a breaking pole and can be coupled and assembled to make up a multipolar unit. Each module 10–16 is latched by its rear face 18 to a symmetrical supporting DIN rail and is fitted with a control lever 20 on its front face. The connection terminals 22 are placed on the narrow side faces 24, 26, while the successive modules 10–16 are coupled by their large side faces 28, 30. The casing outline is standard and the modules can be switch or auxiliary units, for example differential units or signalling or control units associated with the breaking units. Such modular systems are well known to the specialists and will not be described in detail.

On each narrow side face 24, 26 a groove or runner 32, is provided in the form of a channel or track which extends above the terminals 22, in a manner perpendicular to the large faces 28, 30, over the whole width of the narrow face 24, 26. In this runner 32, a connecting part in the form of a slide 36, is mounted by a dove-tail shape 34 to move in a sliding manner through the channel formed by aligned grooves. The length of the slide 36 is just equal to or slightly smaller than the width of the narrow face 24, 26 in order not to protrude beyond faces 28, 30 when the slide 36 is in the inactive central or disengaged position represented in FIG. 3.

The slide 36 is a plastic insulating material is held in the runner 32 by the dove-tail piece 34 provided in the central part of the slide, while the two end edges, each being hooked shaped 38, 40, can be elastically deformed. The hooks 38, 40 are oriented towards the bottom of the runner 32, and work in conjunction with the interlocking notches 42, 44 fitted on the bottom of the groove or runner 32. The front face of the slide 36 is fitted with an operating rib 46 or any other analogous gripping system for moving the slide 36.

With particular reference to FIGS. 4 to 7, it can be seen that the slide 36 and the bottom of the runner 32 with the notches 42–44 in the form of saw teeth, are symmetrically positioned with respect to plane 17, which is parallel to the large side faces 28, 30 of the casing. The vertical sides 46, 48 of the notches 42, 44 face each other on both sides of plane 17 at a sufficient distance "x" from this plane for the catching of the hook 38 when the slide 36 is in a shifted position (FIG. 5). The inclined planes of the notches 42, 44 are oriented towards the outside. In a similar manner, the slide hooks 38, 40 face each other with a distance between them just equal to that of the notches 42, 44 of the two coupled units 10, 12 (see FIG. 7).

The mode of operation of the assembling device is shown in FIGS. 4 to 7:

With the slide 36 in its central position, represented in FIG. 4, the hooks 38, 40 overlap the inclined planes of the notches 42, 44 and hold the slide in this central position. The slide 36, which can be factory fitted after the closing of the casing 10 by simple introduction and sliding in the runner 32, cannot be lost and is entirely housed on the inside of this runner 32. When the slide 36 is moved, for example upward in FIG. 4, the hook 38 becomes deformed to clear the notch 42 and to catch on the notch 44 in the position represented in FIG. 5, whereby the part of the runner 32 to the left of the plane of symmetry 17 is completely freed. In FIG. 6, two coupled modules 10, 12 can be seen, the slide 36 of module 12 being in the shifted position of the top and the slide 36 of module 10 undergoing movement to the bottom towards the ratched position represented by FIG. 7. In this position the slide 36 ratched or caught on the notch 44 of module 10 and notch 42 of module 12 holds these two modules together. They can be separated by the deformation of one of the hooks 38, 40, for example by means of a screwdriver. Any number of modules 10-16 can thus be assembled, the unit being symmetric and the slide 36 capable of being moved indifferently towards the left or the right.

The positioning of the runners 32, of the notches 42, 44 and of the hooks 38, 40 can of course be different and any alteration in the runner would not distract from the general outline of the invention, for example on the front face of the casings, or by using a slide in the form of a bar which crosses a housing fitted in the casing.

I claim:

1. A fastening device for assembling together at least two modular casings in a side by side relationship, said fastening device comprising:
    a groove provided in a face of each of said casings, the groove of one casing being aligned with the groove of an adjacent casing to form a channel across said faces of said casings, each of said grooves having first engaging surfaces;
    a connecting slide slidably mounted in said groove for selective reciprocal movement in said channel between a fastened position and a disengaged position, said slide having a guide portion for guiding the slide in the groove and a second engaging surface at each end of said slide;
    one of the second engaging surfaces of said slide engaging one of the first engaging surfaces on the groove of one casing and another of the second engaging surfaces of said slide engaging another of the first engaging surfaces on the grooves of an adjacent casing in the fastened position of said slide, the distance between the second engaging surfaces on said slide corresponding to the distance between said first engaging surfaces on said one casing and said adjacent casing, the distance between said second engaging surfaces being no greater than the width of said face of said casing.

2. The fastening device of claim 1, wherein the slide is located completely on one face of a casing in the disengaged position.

3. The fastening device of claim 1, wherein the first engaging surface of said groove is a notch and the second engaging surface of said slide is a hook.

4. The fastening device of claim 3, wherein the groove of one casing includes two symmetrically positioned notches disposed in the bottom of said groove, the slide having two symmetrically positioned hooks for selectively engaging one of said notches.

5. The fastening device of claim 1, wherein the second engaging surfaces are elastically deformable.

6. The fastening device of claim 1 adapted for use on casings having two relatively narrow faces with terminals and two relatively large side faces, said groove extending above said terminals and across the entire width of said narrow face, the slide projecting beyond the plane of a large side face in the fastened position and being located between the large side faces in the disengaged position.

* * * * *